United States Patent
Huang

(10) Patent No.: US 6,362,048 B1
(45) Date of Patent: Mar. 26, 2002

(54) METHOD OF MANUFACTURING FLOATING GATE OF FLASH MEMORY

(75) Inventor: Shui-Chin Huang, Ben-Yuan St. Tainan (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/826,798

(22) Filed: Apr. 4, 2001

(30) Foreign Application Priority Data

Nov. 2, 2000 (TW) .......................................... 89123054

(51) Int. Cl.[7] ............................................ H01L 21/336
(52) U.S. Cl. ........................ 438/257; 438/264; 438/269; 438/976
(58) Field of Search ................................ 438/257, 267, 438/264, 302, 983, 266, 258, 269, 593, 739, 976; 257/315, 347, 316–326

(56) References Cited

U.S. PATENT DOCUMENTS

| 5,981,341 | A | * | 11/1999 | Kim et al. | .................... | 438/229 |
| 6,020,237 | A | * | 2/2000 | Shrivastava et al. | ......... | 438/257 |
| 6,069,380 | A | * | 5/2000 | Chou et al. | .................. | 257/315 |
| 6,143,609 | A | * | 11/2000 | Sato et al. | .................... | 438/257 |
| 6,197,637 | B1 | * | 3/2001 | Hsu et al. | ..................... | 438/257 |
| 6,255,165 | B1 | * | 7/2001 | Thurgate et al. | ............. | 438/257 |
| 6,259,133 | B1 | * | 7/2001 | Gardner et al. | .............. | 257/315 |
| 6,261,907 | B1 | * | 7/2001 | Chang | ......................... | 438/257 |
| 6,284,603 | B1 | * | 9/2001 | Ho Simon et al. | ........... | 438/257 |
| 6,326,263 | B1 | * | 12/2001 | Hsieh | .......................... | 257/316 |
| 6,329,688 | B1 | * | 12/2001 | Arai | ............................ | 257/320 |
| 2001/0016385 | A1 | * | 8/2001 | Chiang et al. | .............. | 438/257 |
| 2001/0019867 | A1 | * | 9/2001 | Kawata et al. | .............. | 438/257 |
| 2001/0026973 | A1 | * | 10/2001 | Yeh et al. | .................... | 438/239 |
| 2001/0029076 | A1 | * | 10/2001 | Lin et al. | ..................... | 438/257 |

* cited by examiner

*Primary Examiner*—Michael S. Lebentritt
(74) *Attorney, Agent, or Firm*—Jiawei Huang; J. C. Patents

(57) ABSTRACT

A method for manufacturing the floating gate of a flash memory. First, a substrate is provided. A gate oxide layer, a polysilicon layer and a silicon nitride layer are sequentially formed over the substrate. Gate position is defined and then the silicon nitride layer above the gate position is removed. Th exposed polysilicon layer is oxidized to from a floating gate oxide layer. A buffer layer is formed over the silicon nitride layer and the floating gate oxide layer. A first spacer is formed on the sidewall of the buffer layer. Thereafter, a second spacer is formed. Using the second spacer as a mask, the exposed floating gate oxide layer is removed. The buffer layer, the first spacer and the second spacer above the polysilicon layer and the floating gate oxide layer are removed. Finally, the polysilicon layer not covered by the floating gate oxide layer is removed to form a complete floating gate of a flash memory.

14 Claims, 7 Drawing Sheets

METHOD OF MANUFACTURING FLOATING GATE OF FLASH MEMORY

CROSS-REFERENCE TO RELATED APPLICATION

This application claims the priority benefit of Taiwan application serial no. 89123054, filed Nov. 2, 2000.

BACKGROUND OF THE INVENTION

1. Field of Invention

The present invention relates to a method of manufacturing flash memory. More particularly, the present invention relates to a method of manufacturing the floating gate of a flash memory.

2. Description of Related Art

Non-volatile memory is now extensively used in many electronic devices such as data storage units. Nowadays, many types of non-volatile memories can even be programmed and erased by electrical means, for example, the electrical erasable programmable read-only-memories (EEPROMs). The programmability and erasability of data in a conventional EEPROM is achieved through the floating gate of a transistor. The floating gate facilitates writing, erasing and storage of data. However, EEPROMs has a slower accessing speed. Hence, a faster-operating EEPROM device known as flash memory has been developed.

In general, each flash memory cell has two gate structures, one is a floating gate while the other is a control gate. The floating gate is an electrode for holding electric charges. The control gate is an electrode that controls the writing and reading of data to and from the memory cell. In general, the control gate is connected to a word line and the floating gate is located above the control gate. The floating gate is typically disconnected from other circuitry, that means, the floating gate is in a 'floating' state. According to the position of the control gate, a flash memory cell can be divided into a stacked gate type and a detached gate type.

The channel of a conventional detached gate type of flash memory generally has two portions, a control gate channel and a floating gate channel. By controlling the two channels, on/off states of the memory cell are under control. The control gate of the detached gate flash memory covers only a portion of the floating gate. The control gate and the floating gate are coupled to each other through a coupling ratio ($\alpha_{CF}$). In general, the coupling ratio between the control gate and the floating gate needs to be increased and alignment errors need to be prevented. This is because alignment errors can lead the active region not covered by the floating gate forming a conductive channel between the source and the drain terminal after the control gate is formed. Hence, a portion of the isolation region is normally covered by the floating gate to increase the coupling ratio and to ensure complete coverage of the active region by the floating gate.

FIGS. 1 through 7 are perspective views showing the progression of steps for producing the floating gate of a conventional flash memory. As shown in FIG. 1, a substrate 100 is provided. The substrate 100 has a shallow trench isolation (STI) structure 102. A gate oxide layer 104 is formed over the substrate 100. A doped polysilicon layer 106 is formed over the gate oxide layer 104 later serving as a floating gate. A silicon nitride layer is formed over the polysilicon layer 106. To obtain a floating gate with a width of about 3000 Å, the silicon nitride layer 108 must have a thickness slightly greater than 3000 Å. A patterned photoresist layer 110 is formed over the silicon nitride layer 108 so that positions of the floating gate are defined.

As shown in FIG. 2, the exposed silicon nitride layer 108 is removed to expose a portion of the polysilicon layer 106. The exposed polysilicon layer 106 is oxidized to form a floating gate oxide layer 112. Because oxidation of the polysilicon layer 106 near the sides of the silicon nitride layer 108 is constrained by the silicon nitride layer 108, a bird's beak profile is formed near the edge of the floating gate oxide layer 112.

As shown in FIG. 3, another silicon nitride layer is formed over the silicon nitride layer 108 and the floating gate oxide layer 112. The newly deposited silicon nitride layer is etched back to expose the silicon nitride layer 108. Ultimately, spacers 114 are formed on the sidewalls of the silicon nitride layer 108 above the floating gate oxide layer 112. Due to the etching step, the spacers 114 cover only a portion of the floating gate oxide layer 112. The portion on each side still covered by the spacers 114 becomes the width of the floating gate. Thereafter, the floating gate oxide layer 112 not covered by the spacers 114 is removed to expose the polysilicon layer 106. Thus, the floating gate oxide layer 112 is cut into two separate portions.

As shown in FIG. 4, the silicon nitride layer 108 and the spacers 114 are removed until the polysilicon layer 106 and the floating gate oxide layer 112 underneath them are exposed. Another silicon nitride layer 116 is formed over the polysilicon layer 106 and the floating gate oxide layer 112. A patterned photoresist layer is formed over the silicon nitride layer 116. The silicon nitride layer 116 not covered by the photoresist layer is removed to turn the silicon nitride layer 116 into one having a shape shown in FIG. 4.

As shown in FIG. 5, yet another silicon nitride layer is formed over the silicon nitride layer 116 and the floating gate oxide layer 116. The newly deposited silicon nitride layer is etched back to expose the silicon nitride layer 116 and the floating gate oxide layer 112. Hence, spacers 118a are formed on the sidewalls of the silicon nitride layer 116 and spacers 118b are formed on the inner sidewalls of the floating gate oxide layer 112.

One major function of the second spacers 118a is to form a floating gate whose edges can cross over the shallow trench isolation, thereby preventing conduction between the source and the drain terminal. Meanwhile, separation between the floating gates will be reduced to smaller than the feature size due to the presence of the spacers 118a. Hence, a higher level of integration can be obtained.

Finally, as shown in FIGS. 6 and 7, the floating gate oxide layer 112 not covered by the spacers 118a and 118b is removed. The silicon nitride layer 116 and the spacers 118a, 118b are removed. The polysilicon layer 106 not covered by the floating gate oxide layer 112 is removed to expose the gate oxide layer 104. Thus, manufacturing steps necessary for producing the floating gate of a flash memory is complete.

The spacers 118a on the sidewalls of the silicon nitride layer 116 protect the underlying floating gate oxide layer 112 against reacting agents so that the edges of the ultimately formed floating gate cross over the shallow trench isolation 102. The crossing of the edges of the floating gate over the shallow trench isolation 102 not only increases the coupling ratio between the floating gate and the control gate, but also prevents alignment errors. Alignment errors can lead the active region not covered by he floating gate forming a conductive channel between the source and the drain terminal after the control gate is formed.

In general, the side edges of a conventional floating gate oxide layer will cross over the shallow trench isolation. Although such a structure has the advantage of preventing conduction between the source and the drain terminal, production steps are complicated and hence costly. Moreover, to obtain a floating gate having a width of 3000 Å, the silicon nitride layer 108 must have a thickness slightly greater than 3000 Å. Since the spacers 114 are formed on the sidewalls of the silicon nitride layer 108, thickness of the spacers 114 must also be greater than 3000 Å. Such a thick layer of spacers 114 not only can cause particle contamination during deposition, but can also cause longer period to strip it off in a subsequent step.

SUMMARY OF THE INVENTION

Accordingly, one object of the present invention is to provide a method for manufacturing a floating gate that involves forming a buffer layer, a first spacer and a second spacer. The method is capable of avoiding the use of a thick first spacer.

To achieve these and other advantages and in accordance with the purpose of the invention, as embodied and broadly described herein, the invention provides a method for manufacturing the floating gate of a flash memory. First, a substrate is provided. A gate oxide layer, a polysilicon layer and a silicon nitride layer are sequentially formed over the substrate. Gate position is defined and then the silicon nitride layer above the gate position is removed. The exposed polysilicon layer is oxidized to from a floating gate oxide layer. A buffer layer is formed over the silicon nitride layer and the floating gate oxide layer. A first spacer is formed on the sidewall of the buffer layer. hereafter, a second spacer is formed. Using the second spacer as a mask, the exposed floating-gate oxide layer is removed. The buffer layer, the first spacer and the second spacer above the polysilicon layer and the floating gate oxide layer are removed. Finally, the polysilicon layer not covered by the floating gate oxide layer is removed to form a complete floating gate of a flash memory.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
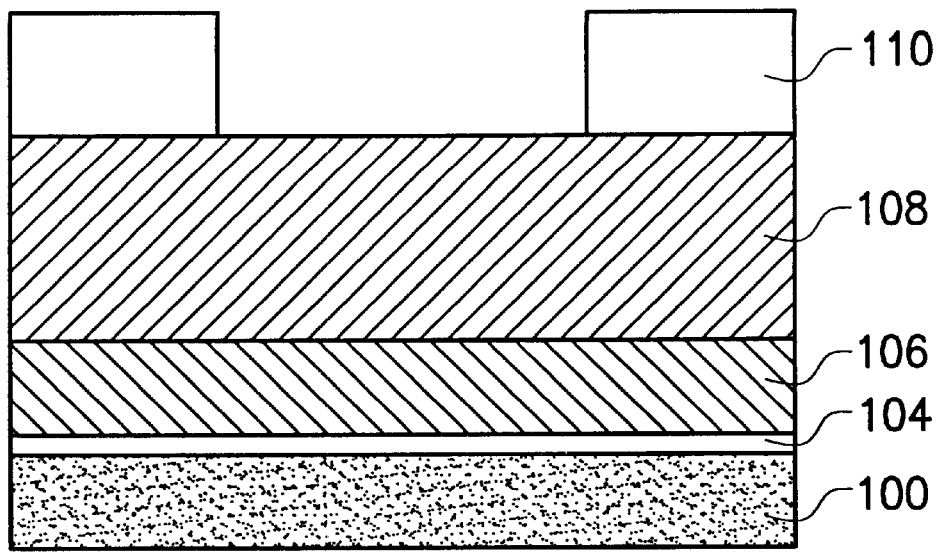
FIGS. 1 through 7 are perspective views showing the progression of steps for producing the floating gate of a conventional flash memory.
Figure 2:
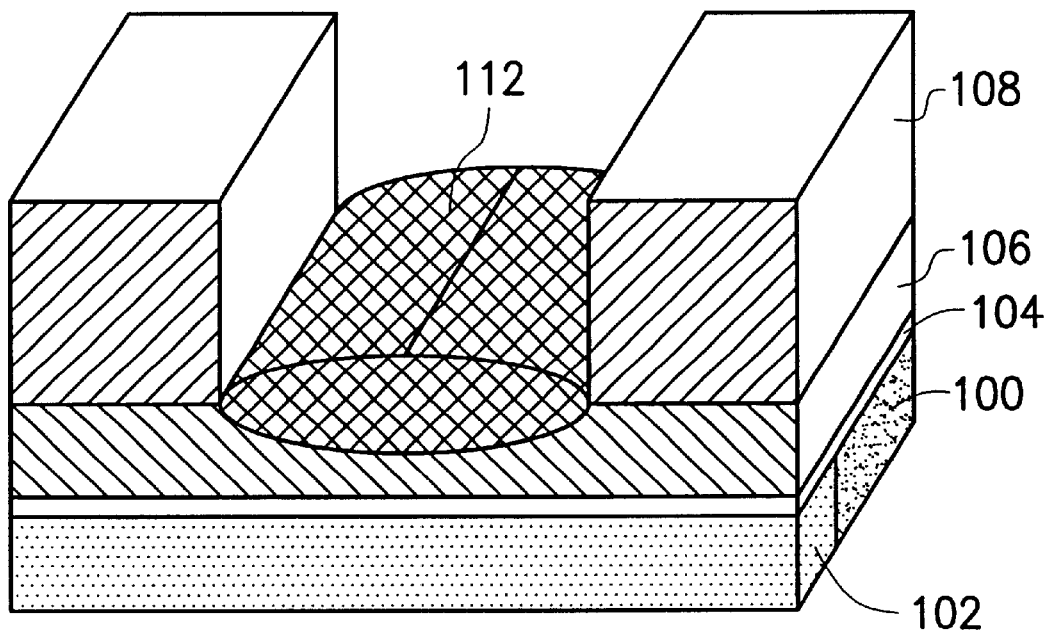
Figure 3:
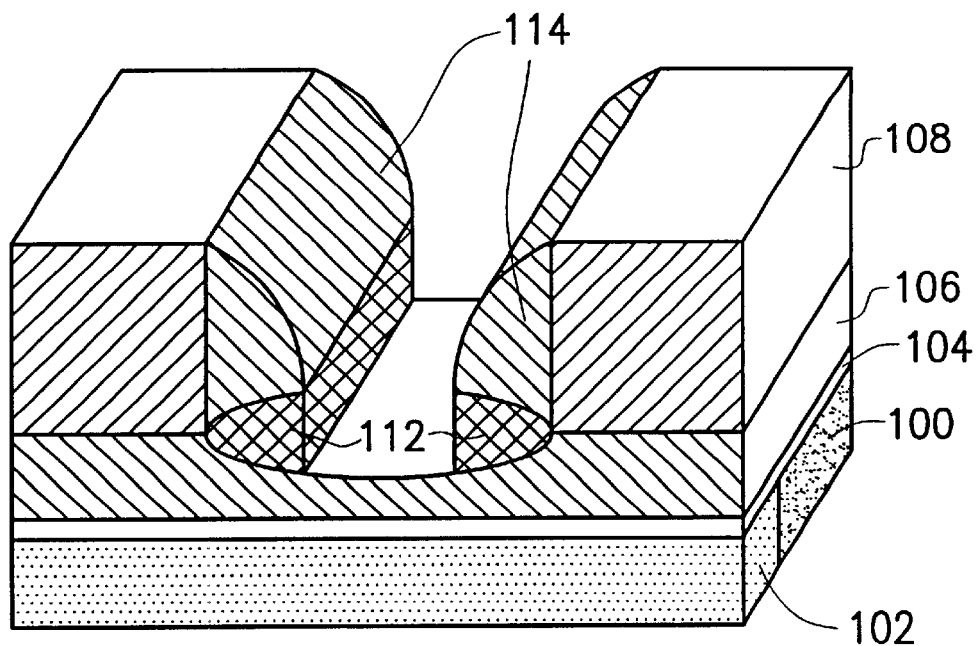
Figure 4:
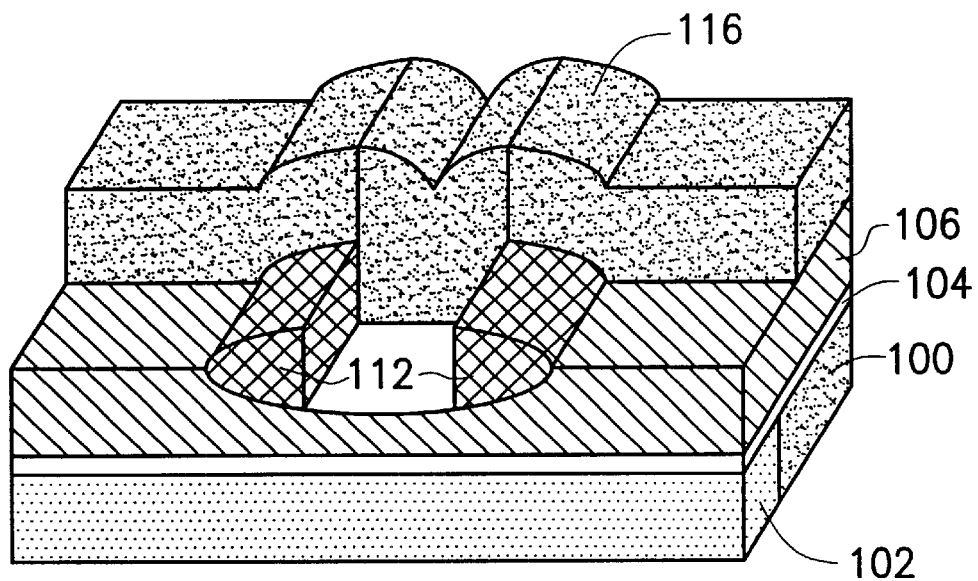
Figure 5:
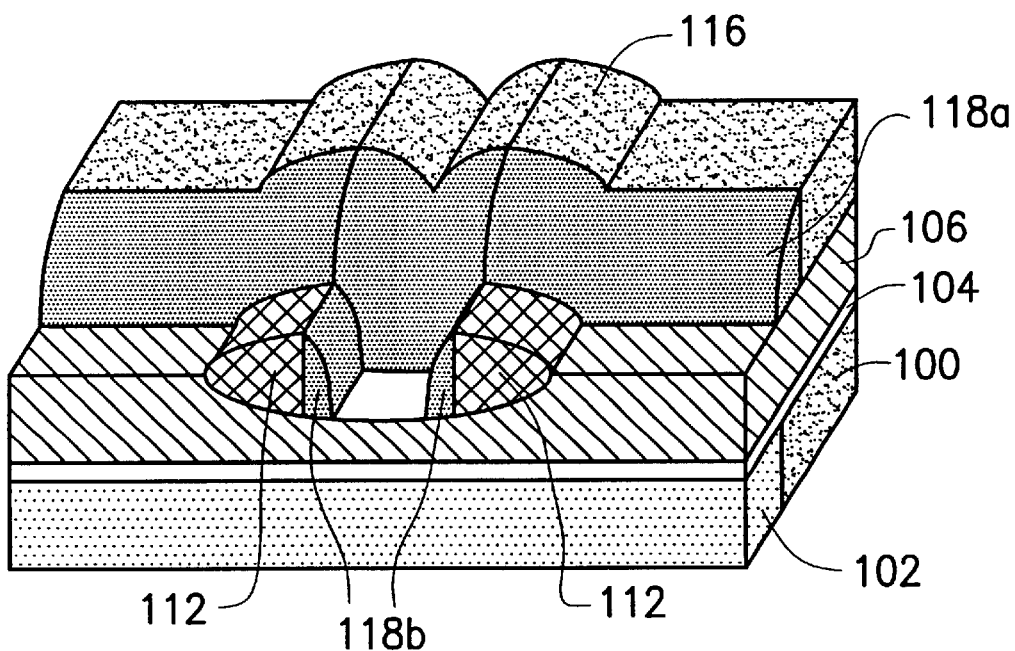
Figure 6:
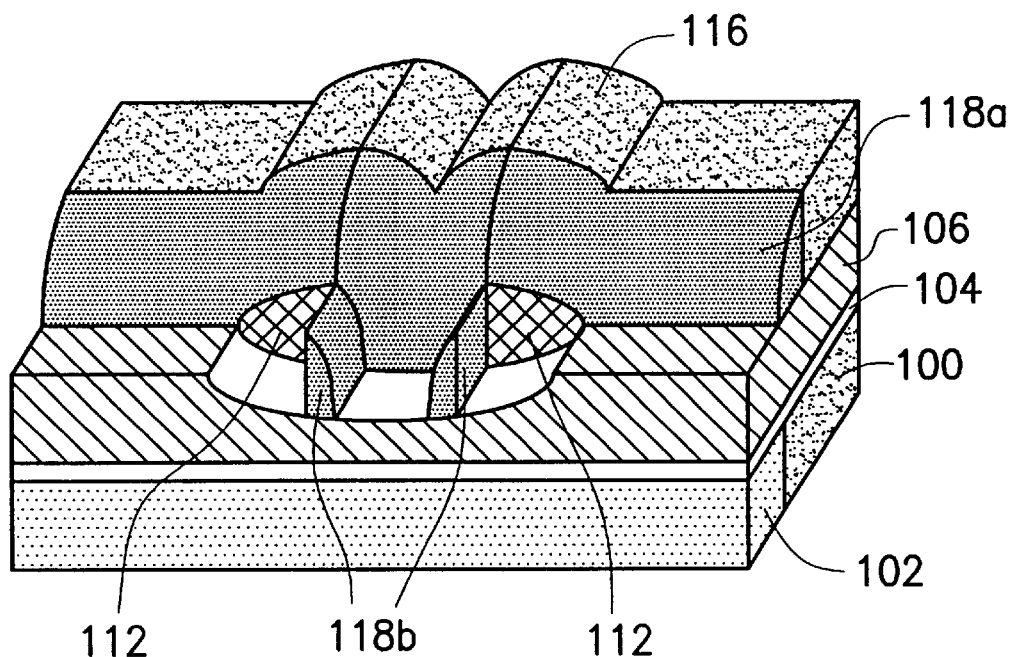
Figure 7:
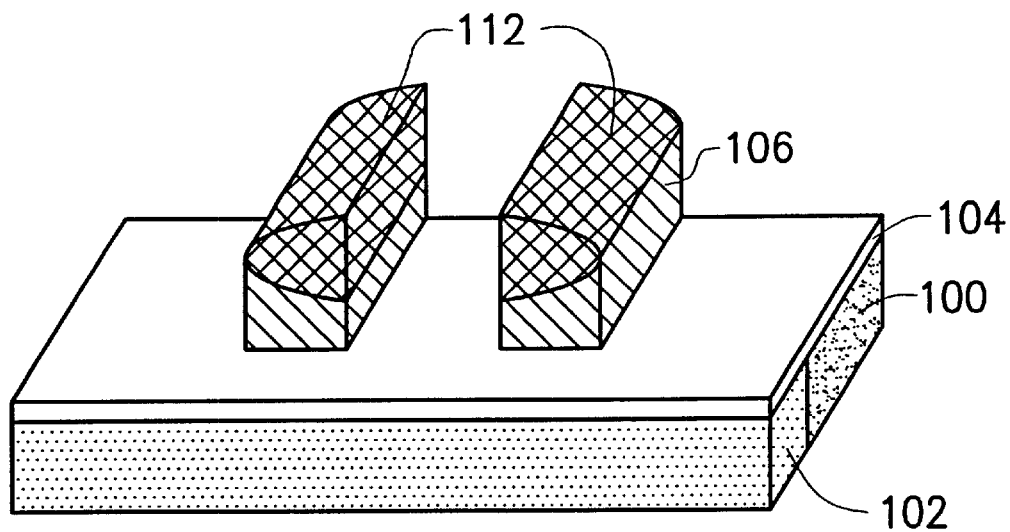

Reference will now be made in detail to the present preferred embodiments of the invention, examples of which are illustrated in the accompanying drawings. Wherever possible, the same reference numbers are used in the drawings and the description to refer to the same or like parts.

FIGS. 8 through 14 are perspective views showing the progression of steps for manufacturing the floating gate of a flash memory according to one preferred embodiment of this invention.

Figure 8:
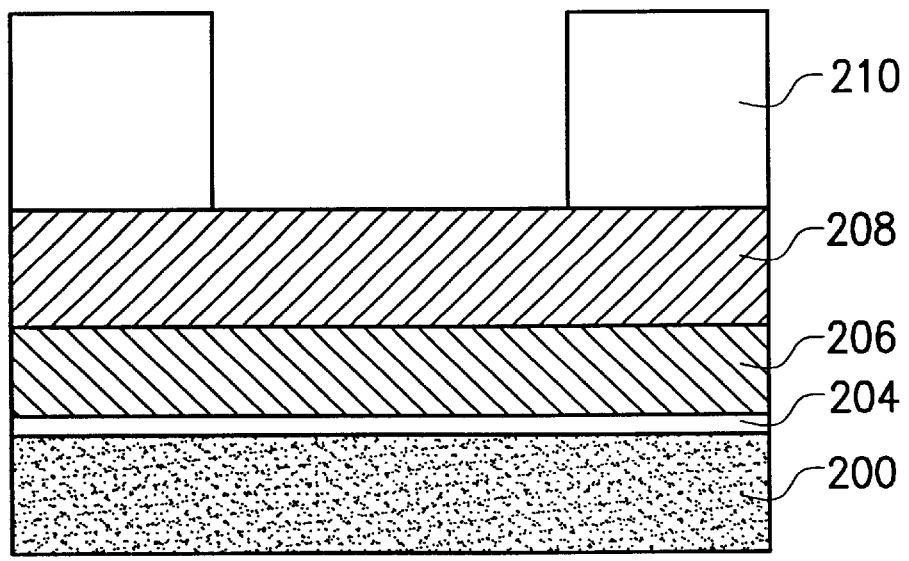
FIGS. 8 through 14 are perspective views showing the progression of steps for manufacturing the floating gate of a flash memory according to one preferred embodiment of this invention.

As shown in FIG. 8, a substrate 200 is provided. The substrate 200 has an active region and an isolation region. The active region is bounded by shallow trench isolation (STI) structure 202, for example. A gate oxide layer 204 is formed over the substrate 200. A doped polysilicon layer 206 is formed over the gate oxide layer 204. The polysilicon layer 206 later serves as a floating gate layer. A silicon nitride layer 208 is formed over the polysilicon layer 206. A patterned photoresist layer 210 is formed over the silicon nitride layer 208 so that position of the floating gate is defined.

Figure 9:
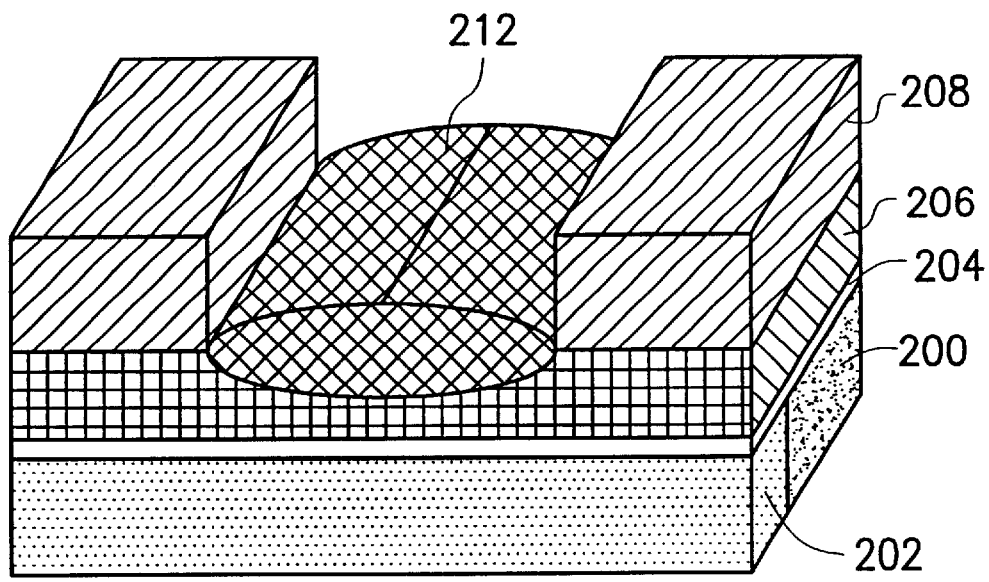

As shown in FIG. 9, the exposed silicon nitride layer 208 is removed to expose a portion of the polysilicon layer 206. The exposed polysilicon layer 206 is oxidized to form a floating gate oxide layer 212. Constrained by the silicon nitride layer 208, the floating gate oxide layer 212 has a bird's beak structure near its edges.

Figure 10:
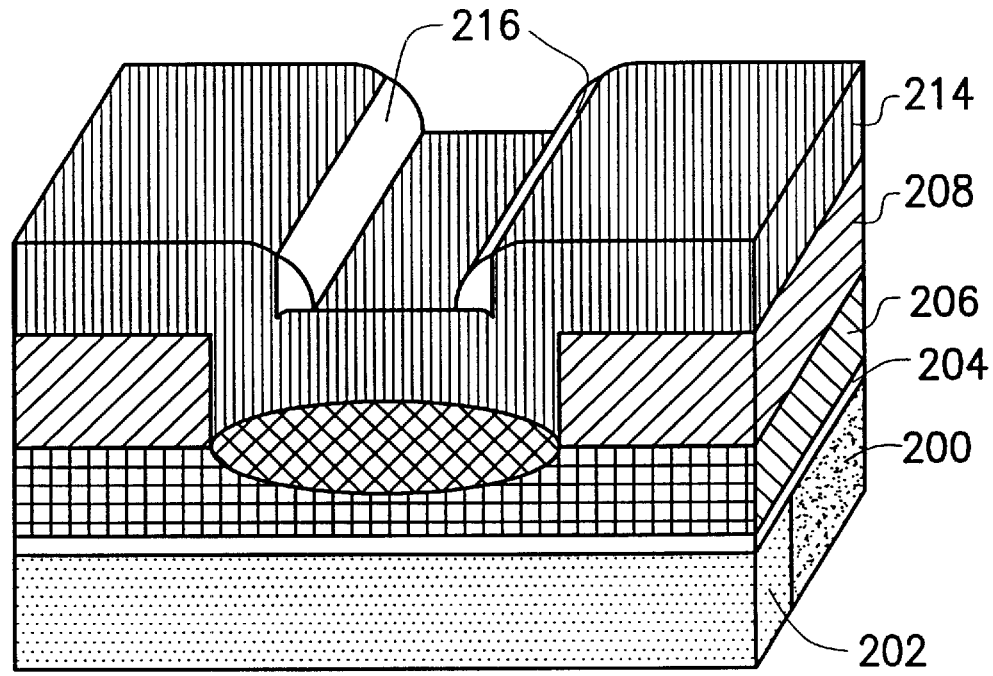

As shown in FIG. 10, a buffer layer 214 is formed over the silicon nitride layer 208 and the floating gate oxide layer 212. Preferably, the buffer layer has a thickness of less than 3000 angstroms. The buffer layer 214 can be a polysilicon layer, for example. A first spacer 216 having a thickness of less than 3000 angstroms is formed on the sidewall of the buffer layer 214. The first spacer 216 can be formed, for example, by deposition silicon nitride in a low-pressure chemical vapor deposition (LPCVD) and then etching back the silicon nitride layer until the buffer layer 214 is exposed.

The buffer layer 214 can also be a silicon nitride layer if the aforementioned silicon nitride layer 208 is replaced by a polysilicon layer. One basic criterion is that the buffer layer 214 and the silicon nitride layer 208 are formed using different materials.

Figure 11:
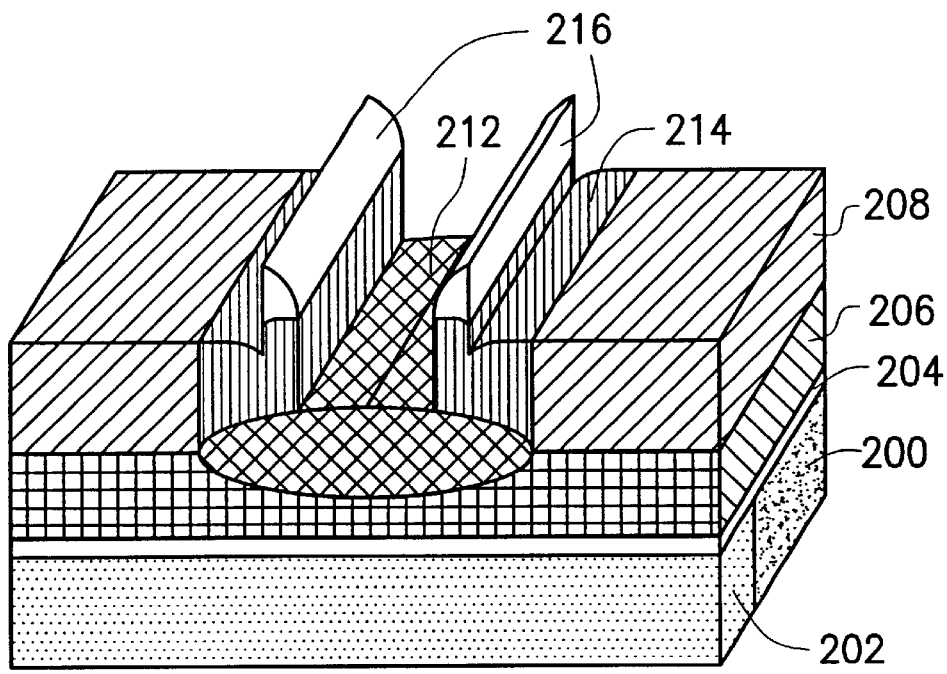

As shown in FIG. 11, the buffer layer 214 is removed to expose a portion of the silicon nitride layer 208 and to expose a portion of the floating gate oxide layer 212. Ultimately, a portion of the buffer layer 214 remains above the sides of the floating gate oxide layer 212 and under the first spacer 216.

Figure 12:
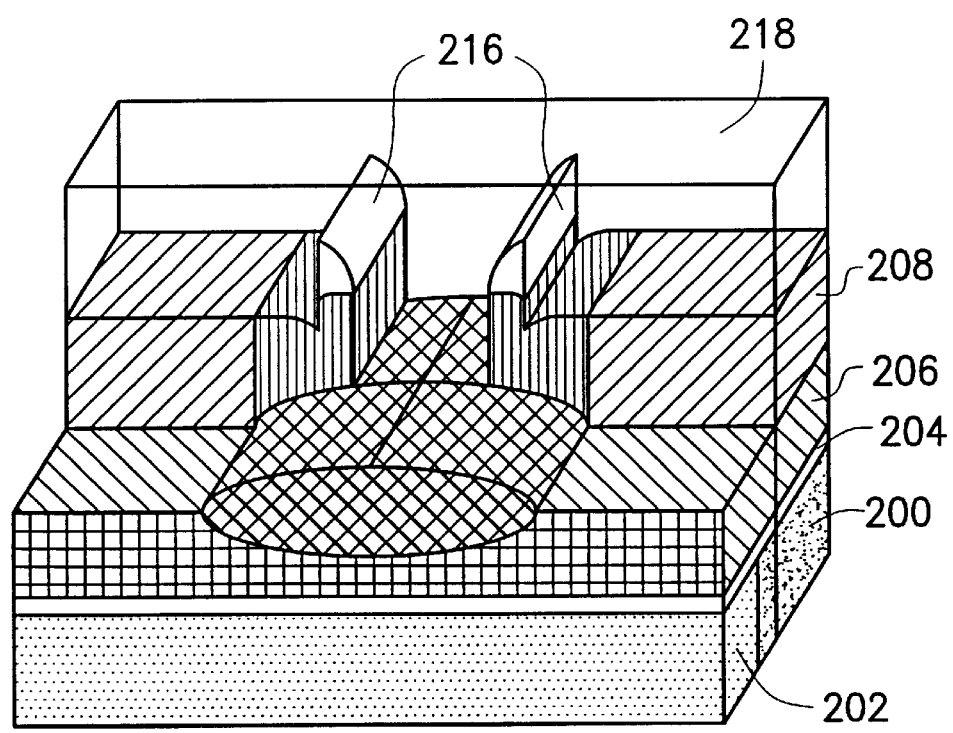

As shown in FIG. 12, a photoresist layer 218 is formed over the active region of the substrate 200 covering the first spacer 216, the buffer layer 214 and the silicon nitride layer 208. The exposed (not covered by the photoresist layer 218, the isolation region) first spacer 216, the buffer layer 214 and the silicon nitride layer 208 are removed.

Figure 13:
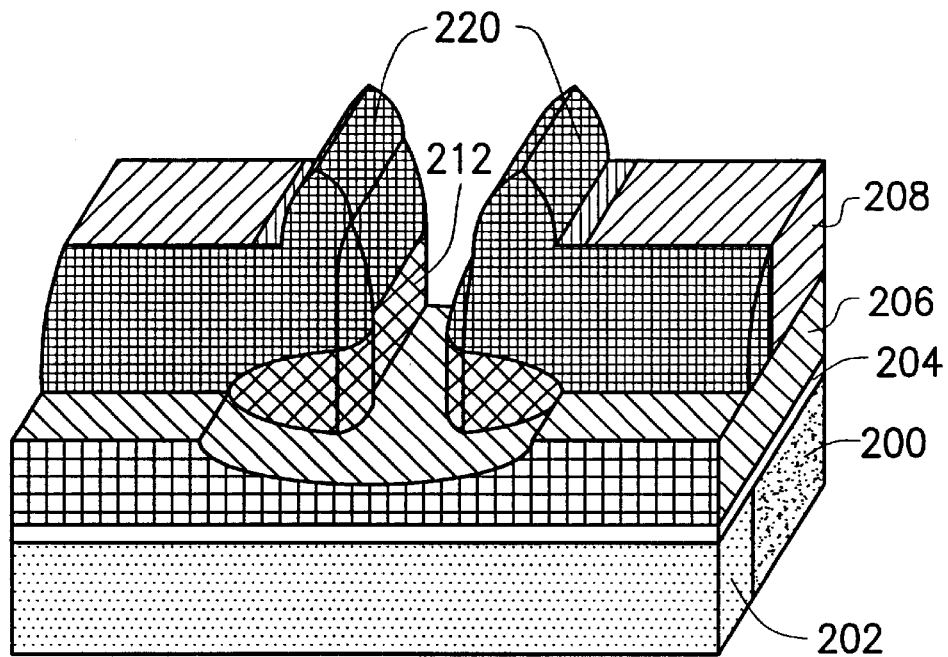

As shown in FIG. 13, the photoresist layer 218 is removed. A second spacer 220 is formed on the sidewall of the first spacer 216, the buffer layer 214 and the silicon nitride layer 208. The second spacer 220 can be formed, for example, by depositing silicon nitride in a low-pressure chemical vapor deposition (LPCVD) over the first spacer 216, the buffer layer 214, the silicon nitride layer 208 and then etching back the newly deposited silicon nitride to expose the floating gate oxide layer 212 and the silicon nitride layer 208. Using the second spacer 220 as a mask, the exposed floating gate oxide layer 212 is removed to expose a portion of the polysilicon layer 206.

The purpose for forming the second spacer 220 is equivalent to the forming of spacers 114 and 118a in the conventional method. However, the second spacer 220 can achieve both functions at the same time. In a conventional method, the spacer 118a facilitates the crossing of the edges of the subsequently formed floating gate over the shallow trench isolation (STI) structure. Hence, the formation of a conductive channel between the source and the drain terminal is prevented. In addition, a smaller feature size separating two floating gates is formed so that a higher level of integration can be achieved. The second spacer 220 is also capable of such functions.

Figure 14:
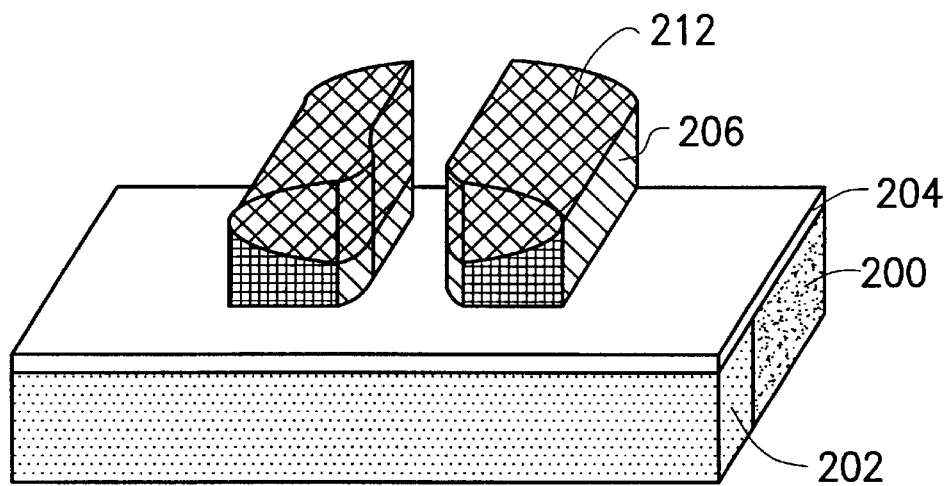

As shown in FIG. 14, the second spacer 220, the silicon nitride layer 208 and the buffer layer 214 above the floating gate oxide layer 212 and the polysilicon layer 206 are removed. The polysilicon layer 206 not covered by the floating gate oxide layer 216 is removed to expose the gate oxide layer 204, thereby forming the floating gate of a flash memory.

One major characteristics of this invention is the introduction of a buffer layer, thereby lowering the thickness of the spacer required for defining the width of a floating gate. Hence, particle contamination during spacer deposition is minimized and time for stripping it off subsequently is reduced.

The second spacer 220 serves an identical function as the spacers 114 and 118a. The second spacer 220 is capable of reducing separation between neighboring floating gates, and hence increasing the level of integration. Since the spacer 220 in this invention is able to perform the function of the spacer 114 and the spacer 118a, complexity of manufacturing is reduced considerably.

In summary, by forming a buffer layer, a first spacer and a second spacer, this invention is able to eliminate the requirement for forming a thick first spacer and reduce the number of production steps.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing the floating gate of a flash memory, comprising the steps of:

providing a substrate having an active region and an isolation region thereon;

forming a tunneling oxide layer over the substrate;

forming a polysilicon layer over the tunneling oxide layer;

forming a silicon nitride layer over the polysilicon layer;

defining a position for forming a floating gate position in the active region;

removing the silicon nitride layer above the floating gate position to form an opening;

oxidizing the polysilicon layer exposed by the opening to form a floating gate oxide layer;

forming a buffer layer over the substrate;

forming a first spacer on the sidewall of the buffer layer;

removing a portion of the buffer layer not covered by the first spacer to expose a portion of the silicon nitride layer;

removing the first spacer, the buffer layer and the silicon nitride layer outside the active region;

forming a second spacer on the sidewall of the first spacer, the buffer layer and the silicon nitride layer;

removing the floating gate oxide layer not covered by the second spacer;

removing the second spacer;

removing the buffer layer; and removing the polysilicon layer not covered by the floating gate oxide layer to form the floating gate.

2. The method of claim 1, wherein material forming the buffer layer includes polysilicon.

3. The method of claim 1, wherein material forming the buffer layer includes silicon nitride.

4. The method of claim 1, wherein material forming the first spacer includes silicon nitride.

5. The method of claim 1, wherein material forming the second spacer includes silicon nitride.

6. The method of claim 1, wherein the buffer layer having a thickness of about less than 3000 angstroms.

7. The method of claim 1, wherein the first spacer having a thickness of about less than 3000 angstroms.

8. A method for manufacturing the floating gate of a flash memory, comprising the steps of:

providing a substrate;

forming a tunneling oxide layer over the substrate;

forming a polysilicon layer over the tunneling oxide layer;

forming a silicon nitride layer over the polysilicon layer;

defining a position for forming a floating gate;

removing the silicon nitride layer above the floating gate position to form an opening;

oxidizing the polysilicon layer exposed by the opening to form a floating gate oxide layer;

forming a buffer layer over the floating gate oxide layer and the silicon nitride layer;

forming a first spacer on the sidewall of the buffer layer;

removing the buffer layer not covered by the first spacer to expose the silicon nitride layer;

removing the first spacer, the buffer layer and the silicon nitride layer outside the active region;

forming a second spacer on the sidewall of the first spacer, the buffer layer and the silicon nitride layer;

removing the floating gate oxide layer not covered by the second spacer;

removing the second spacer;

removing the buffer layer; and removing the polysilicon layer not covered by the floating gate oxide layer to form the floating gate.

9. The method of claim 8, wherein material forming the buffer layer includes polysilicon.

10. The method of claim 8, wherein material forming the buffer layer includes silicon nitride.

11. The method of claim 8, wherein material forming the first spacer includes silicon nitride.

12. The method of claim 8, wherein material forming the second spacer includes silicon nitride.

13. The method of claim 8, wherein the buffer layer having a thickness of less than 3000 angstroms.

14. The method of claim 8, wherein the first spacer having a thickness of less than 3000 angstroms.

* * * * *